(12) United States Patent
Xue et al.

(10) Patent No.: US 8,648,247 B2
(45) Date of Patent: Feb. 11, 2014

(54) SOLARTURF: SOLAR ENERGY HARVESTING ARTIFICIAL TURF

(75) Inventors: Jiangeng Xue, Gainesville, FL (US); Franky So, Gainesville, FL (US); Kirk S. Schanze, Gainesville, FL (US); John R. Reynolds, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 343 days.

(21) Appl. No.: 12/745,285

(22) PCT Filed: Nov. 26, 2008

(86) PCT No.: PCT/US2008/084917
§ 371 (c)(1),
(2), (4) Date: Sep. 24, 2010

(87) PCT Pub. No.: WO2009/070706
PCT Pub. Date: Jun. 4, 2009

(65) Prior Publication Data
US 2011/0023934 A1 Feb. 3, 2011

Related U.S. Application Data

(60) Provisional application No. 60/990,807, filed on Nov. 28, 2007.

(51) Int. Cl.
*H01L 31/045* (2006.01)

(52) U.S. Cl.
USPC .......................................... 136/245; 136/263

(58) Field of Classification Search
None
See application file for complete search history.

(56) References Cited

U.S. PATENT DOCUMENTS

2005/0022865 A1 2/2005 Robeson et al.
2005/0072458 A1 4/2005 Goldstein
2005/0263178 A1 12/2005 Montello et al.
2006/0130895 A1 6/2006 Gaudiana et al.

FOREIGN PATENT DOCUMENTS

WO WO 2009-058877 5/2009
WO WO 2009-117025 9/2009

OTHER PUBLICATIONS

Thompson et al, Spectral Broadening in MEH-PPV:PCBM-Based Photovoltaic Devices via Blending with a Narrow Band Gap Cyanovinylene-Dioxythiophene Polymer, Macromolecules 2005, 38, 5359-5362, May 24, 2005.*

(Continued)

*Primary Examiner* — Jennifer Michener
*Assistant Examiner* — Matthew Zapadka
(74) *Attorney, Agent, or Firm* — Saliwanchik, Lloyd & Eisenschenk

(57) ABSTRACT

A SolarTurf unit has a plurality of solar blades, each blade comprising a donor-acceptor conjugated polymer (DA-CP) disposed between and electrically contacting a working electrode and a counter electrode where at least one of electrodes is transparent and where the plurality of solar blades have like or different DA-CPs having like color or different colors, for example, green. The SolarTurf unit includes an interconnect strip having a first electrically conductive surface and a second electrically conductive surface separated by an insulator. The working electrodes are electrically connected to the first electrically conductive surface and the counter electrodes are electrically connected to the second electrically conductive surface. The SolarTurf units can be combined into a device for harvesting light energy to provide an electric output. The SolarTurf device can have the appearance of a lawn or other plant, fungi, rock, sand or animal.

16 Claims, 3 Drawing Sheets

R = CH₃ and C₆H₁₃,

(56) References Cited

OTHER PUBLICATIONS

Thompson et al, Soluble Narrow Band Gap and Blue Propylenedioxythiophene-Cyanovinylene Polymers as Multifunctional Materials for Photovoltaic and Electrochromic Applications, JACS Articles, Sep. 19, 2006.*

Liu, J. et al., "Fiber-based architectures for organic photovoltaics," *Applied Physics Letters*, 2007, pp. 063501-1 to 063501-3, vol. 90.

O'Connor, B. et al., "Fiber based organic photovoltaic devices," *Applied Physics Letters*, 2008, pp. 193306-1 to 193306-3, vol. 92.

* cited by examiner

SOLARTURF: SOLAR ENERGY HARVESTING ARTIFICIAL TURF

CROSS-REFERENCE TO RELATED APPLICATIONS

This application is the U.S. national stage application of International Patent Application No. PCT/US2008/084917, filed Nov. 26, 2008, which claims the benefit of U.S. Provisional Application Ser. No. 60/990,807, filed Nov. 28, 2007, the disclosures of which are hereby incorporated by reference in their entireties, including any figures, tables, or drawings.

BACKGROUND OF INVENTION

Artificial turf has been used in sports venues and for landscaping applications because of their durability and virtually maintenance free operation. This is particularly of interest in areas where the availability of water is at a premium. Sunlight reaching the artificial turf is generally wasted. It would be of great economic value to use the large surface area of artificial turf to convert sunlight into a useful energy.

Thus, it can be advantageous to provide an artificial turf or other articles common to landscapes that can convert sunlight into electricity, as well as any materials or methods needed for making the light harvesting artificial turf.

BRIEF SUMMARY

One embodiment of the invention is directed to an assembly of solar blades of a light harvesting artificial turf where each solar blade functions as a solar cell that comprises a working electrodes, a counter electrode disposed about a material comprising at least one donor-acceptor conjugated polymer (DA-CP) where a plurality of donor repeating units are coupled with acceptor repeating units. The DA-CP can be soluble in one or more solvents and has a green color in the neutral state. The solar blades can be flexible and function as a lawn.

The DA-CP can have substituted dioxyheterocycle based donor groups and the dioxyheterocycle can be a dioxythiophene, such as an alkylenedioxythiophene, for example a 3,4-propylenedioxythiophene. The acceptor can be an electron poor aromatic unit such as a substituted or unsubstituted benzothiadiazole, thiadiazoloquinoxaline, quinoxaline, thienothiadiazole, thienopyrazine, pyrazinoquinoxaline, benzobisthiadiazole or thiadiazolothienpyrazine.

Another embodiment of the invention involves a method of forming a light harvesting artificial turf unit comprising assembling a plurality one of solar blades onto an interconnect strip at a pair of conductive interfaces between the one or more solar blades and the interconnect strip. The solar turf unit can have a protective layer to provide electric insulation and environmental stability.

The subject invention further provides a light harvesting artificial turf device formed by assembling one or more light harvesting artificial turf units to achieve a desired electrical signal upon sunlight exposure and a method of collecting solar energy using the light harvesting artificial turf device.

BRIEF DESCRIPTION OF DRAWINGS

The accompanying drawings, which are incorporated in and constitute a part of this specification, illustrate several embodiments of the invention and together with the description, serve to explain the principles of the invention.

DETAILED DISCLOSURE

Figure 1:
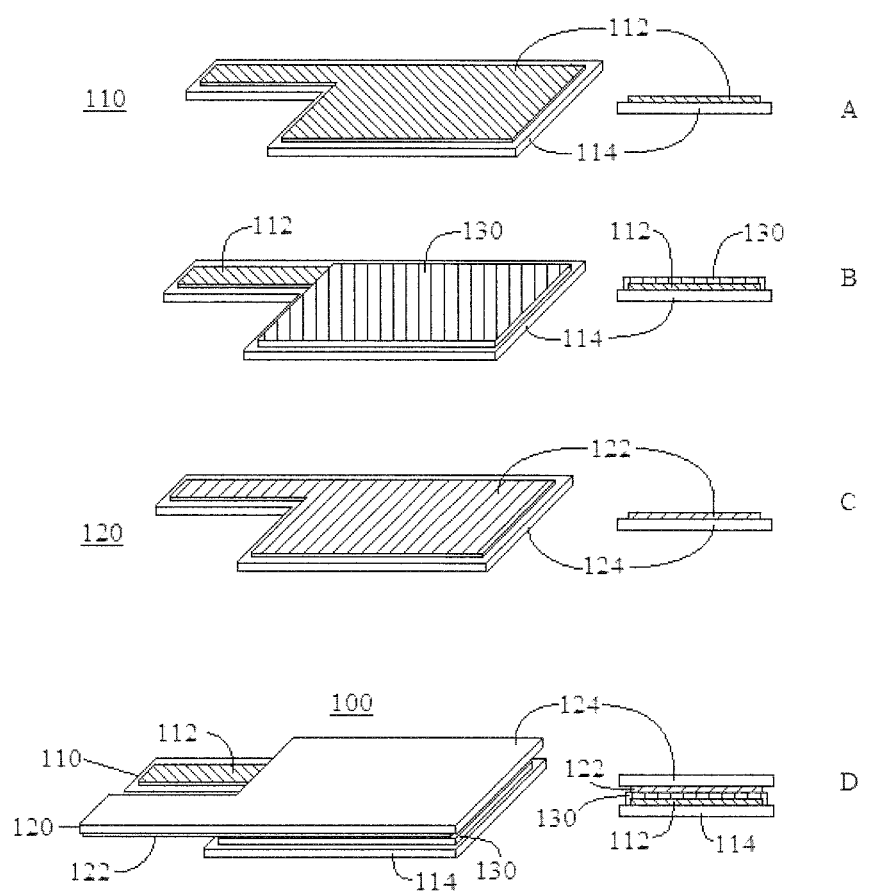
FIG. 1 shows an exemplary method for making a solar blade in accordance with an embodiment of the invention.

Reference is made to the exemplary embodiments of the invention, examples of which are illustrated in the accompanying drawings. Wherever possible, the same reference numbers will be used throughout the drawings to refer to the same or equivalent parts. In the following description, reference is made to the accompanying drawings that form a part thereof, and in which is shown by way of illustrating specific exemplary embodiments in which the invention may be practiced.

Exemplary embodiments provide a light harvesting artificial turf, which is referred to as "SolarTurf" herein. The SolarTurf includes one or more light harvesting artificial blades, which are referred to as "solar blades" herein, that function as solar cells, as well as methods and materials for fabricating the SolarTurf. The advantage of this technology is that the generation of electrical signals from the SolarTurf, which is able to display a desired green color, an alternate color, or multi-colors, can provide an economic benefit that is not possible from existing artificial turf. Although the terms SolarTurf and solar blades implies a light harvesting artificial lawn, and exemplary embodiments are directed to a light harvesting lawn, embodiments of the invention are not so limited. The SolarTurf units can be in the shape of any portion of a plant, fungi, rock, sand or even an animal, such that a sun light harvesting device can appears to be part of a natural or even an unnatural landscape that can be constructed in a manner where the device may be divided into multiple units with multiple surfaces allowing ease of construction and optimizing surface area and allowing absorbance of sunlight from multiple angles and directions. Accordingly, SolarTurf can give a new form factor for solar cells, and represents a novel option for both the landscaping and solar cell industries.

Specifically, each solar blade can include a working electrode, a counter electrode, and a photoactive material sandwiched between the photoactive areas on the working electrode and counter electrode. The solar blade can convert the absorbed light (e.g., sunlight) into electricity and can display a certain desired color. In addition, a unit of SolarTurf can be formed including one or more solar blades assembled electrically and connected by an interconnection strip. Further, a SolarTurf device can be constructed having one or more SolarTurf units through a combination of parallel and/or serial connections to achieve a desired electrical output, such as a desired voltage and/or current, upon exposure to light.

In various embodiments, the solar blade can be configured in various forms including, but not limited to, grass, plants, trees and shrubs, or any desired forms/shapes. The photoactive material can have different colors such as blue, red, green and black. For ease of illustration, several embodiments of the invention will be described with reference to a solar blade in the form of a grass lawn having a green color or in alternate ornamentation or landscapes of other colors or combinations of color.

FIG. 1D depicts an exemplary fabrication of a solar blade 100 in accordance with one embodiment. The solar blade 100 can include a working electrode 110, a counter electrode 120, and a photoactive material, for example, comprising at least one DA-CP 130. The working electrode includes a conductive surface 112 and can include a substrate 114 as illustrated in FIG. 1. The counter electrode can also include a conductive surface 122 and, as illustrated, a substrate 124. The working electrode 110 and the counter electrode 120 are electrically conductive at a photoactive area where the photoactive material 130 contacts the conductive surfaces 112 and 122. The solar blade 100 can be fabricated following the steps below: forming a working electrode 110 having a conductive surface 112 on a substrate 114 (FIG. 1A); forming a photoactive material 130 on the working electrode in the photoactive area (FIG. 1B); forming a counter electrode 120 having a conductive surface 122 on a substrate 124 (FIG. 1C); and laminating the working electrode to the counter electrode to complete a solar blade 100 (FIG. 1D). FIG. 1 is not intended to infer relative dimensions and shapes of the solar blade components nor are they necessarily drawn to scale. The two electrodes 110 and 120 can be free standing and no substrate is needed in some embodiments of the invention. In another embodiment of the invention a solar blade can be formed, where either the working or counter electrode can be a conductive core upon which is uniformly deposited a contacting photoactive material, for example comprising a DA-CP. Upon the photoactive material is deposited a contacting conductor to function as the complementary counter or working electrode. The solar blade formed in this manner will assume the general shape with which the conductive core is prepared if desired. The solar blade can effectively be a fiber if desired. In some embodiments of the invention the solar blade can be coated after assembly of the electrodes about the photoactive material. This coating can act as a barrier to moisture, oxygen and/or light. The coating or other barrier can be used for antireflective properties or to promote multiple internal reflections of the desired wavelengths to enhance the efficiency of the solar blades.

The substrates in the electrodes can be of like material. The substrates are preferably transparent and can be formed of, for example, a plastic such as polyester (e.g., polyethylene terephthalate (PET) and polyethylene naphthalates (PEN)), polyphenylene sulfides (PSS), polyamides, polyimides, polycarbonates, polysulfones, polyethersulfones, or any other transparent materials. The substrate can be formed in any desired shapes that can facilitate a subsequently assembly of the solar blades into an interconnection strip to form a SolarTurf unit. In some embodiments of the invention the solar blades are of sufficient flexibility and durability to support traffic typical to a lawn, on a SolarTurf device constructed from the solar blades. In one embodiment of the invention shown in FIG. 1D, each solar blade can have one or both electrodes having a stem that extends to the photoactive area such that electrical connection to an external circuit can be made to each electrode independently through the stem portions of the solar blade. Other means of electrically connecting the electrodes of the solar blades are readily envisioned by those skilled in the art. Each of the stem and the photoactive area can be of various cross sectional shapes, such as, for example, a rectangular, polygonal, oval, or circular shape and can be of various thicknesses. In some embodiments of the invention the substrate can have a thickness of, for example, about 10 micron through 200 micron, for example about 15 micron through 100 micron. The stem or stems can aid in the mechanical attachment of a solar blade in a SolarTurf unit and can be matched in shape to a site on an interconnect strip in a manner to assure electrical connection that allows the coupling of a plurality of solar blades to the SolarTurf unit.

The conductive surface of each electrode can be an electrode layer deposited on the substrate. The electrode layers of the working electrode and counter electrode can be used to serve as, for example, an anode and a cathode respectively. The electrode layer can be formed using any transparent and conductive material including, but not limited to, a highly conductive metal oxide such as ITO (i.e., indium tin oxide), a conductive polymer such as PEDOT/PSS (i.e., poly(3,4-ethylenedioxythiophene)/poly(styrenesulfonate)), and/or any other conductive as well as optically transparent materials. The electrode layer can be, e.g., printed, deposited, and/or coated, using suitable techniques to cover both surfaces of the stem and the active area of the electrode.

A photoactive material can be formed or deposited on the photoactive area, leaving the conductive stem surface exposed (e.g., for a subsequent electrical contact with an interconnection strip for a SolarTurf unit). The photoactive material can be formed or deposited using, for example, a printing, a coating or any deposition process known to one of ordinary skill in the art. The photoactive material can include one or more photoactive material layers. The photoactive material assembled in each solar blade can absorb sunlight and further convert the absorbed sunlight into electricity. In an embodiment of the invention, the photoactive material can include at least one DA-CP having a plurality of repeating units, the repeating units comprising a plurality of donor groups coupled to an acceptor group. The DA-CP can be soluble in one or more solvents, for example methylene chloride, chloroform, tetrachloroethane, tetrahydrofuran, dioxane, benzene, toluene, xylenes, chlorobenzene, dichlorobenzene, pyridine, ethyl acetate, butanol, ethanol, methanol, acetonitrile, acetone, isopropanol, water and mixtures thereof. The DA-CP can have a plurality of substituted dioxyheterocycle based donor groups and the acceptor group can be an electron poor aromatic.

Examples of suitable donor acceptor polymers can include polymers having the structural repeating units of Formula I below:

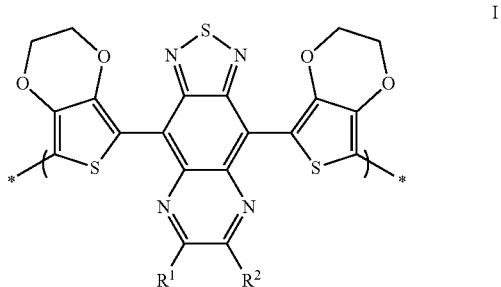

I where $R^1$ and $R^2$ can be independently chosen from alkyl groups, such as, for example, $C_1$ to $C_{10}$ alkyl groups. In one embodiment, $R^1$ and $R^2$ can be chosen from either methyl, hexyl groups or other suitable groups.

Another example of suitable donor acceptor polymers can include polymers having the structural repeating units of Formula II below:

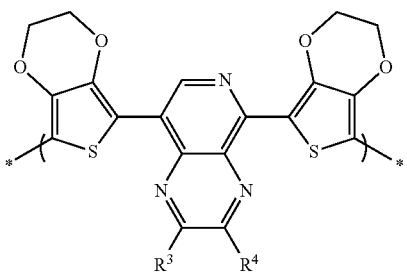

II where $R^3$ and $R^4$ can be independently chosen from aryl groups, such as, for example, phenyl, benzyl, tolyl groups or other suitable groups. In one embodiment, the DA-CP polymer can be a homopolymer of the Formula II repeating unit. One such exemplary homopolymer can be poly[2,5 bis(2-ethylenedioxythienyl)diphenylpyridopyrazine].

In various embodiments, additional exemplary conjugated polymers that can be employed as the photoactive material for the solar blades 100 are disclosed in copending Beaujuge et al., "Green to Transmissive Soluble Electrochromic Polymers", International Application No. PCT/US2008/081599, filed Oct. 29, 2008 which claims the benefit of U.S. Provisional Application Ser. No. 61/000,908, filed Oct. 30, 2007, both disclosures are incorporated herein by reference in their entirety. In various embodiments, additional exemplary conjugated polymers that can be employed as the photoactive material for the solar blades 100 are disclosed in copending Beaujuge et al., "Black Soluble Conjugated Polymers With Highly Transmissive Oxidized State" International Application No. PCT/US2008/081606; filed Oct. 29, 2008 which claims benefit of U.S. Provisional Application Ser. No. 61/070,102, filed Mar. 19, 2008.

The photoactive material can be green in color with many variants. In various embodiments, the disclosed photoactive material can include neutral state green colors that can be achieved including a range of colors defined by the CIE Lab color system having negative "a" values ranging from about 15 to large values (e.g., 60); and concurrent "b" values ranging from about −30 to about +30, although green colors outside of this range can also be achieved and used for the photoactive material. In some embodiments, the photoactive material can include an optional dye component.

Figure 2:
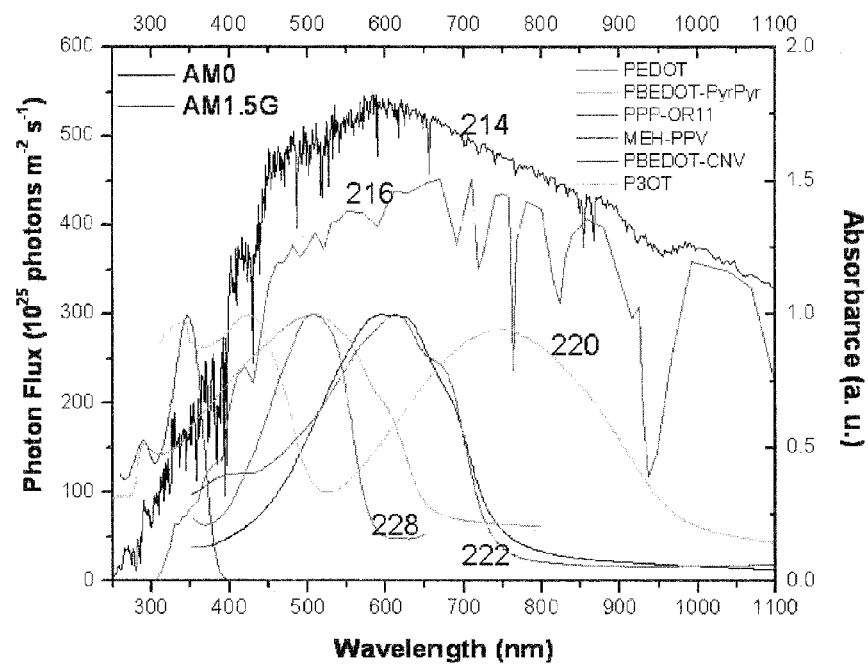
FIG. 2 depicts light absorption spectra of various exemplary polymers in accordance with embodiments of the invention.

However, it will also be understood that other colored (e.g., yellow, red, blue, black, etc.) photoactive material can be used in the disclosed solar blades, and therefore other colored SolarTurf or multi colored SolarTurf can be formed. FIG. 2 depicts an exemplary result showing the photon flux from the sun in space (see curve 214), and on earth (see curve 216) with light absorption spectra for a series of photoactive DA-CP having various colors in accordance with embodiments of the invention, for example, PBEDOT-PyrPyr (poly {5,8-bis(3,4-ethylenedioxy-2-thienyl)-2,3-diphenyipyrido[3,4-b]pyrazine}) absorbs according to curve 220, PBEDOT-CNV poly (1,2-(2-ethylene dioxythienyl)cyanovinylene) absorbs according to curve 222, and MEH-PPV (poly[2-methoxy-5-(T-ethyl-hexyloxy)-1,4-phenylene vinylene]) absorbs according to curve 228. In various embodiments, by selecting a suitable polymer or polymer combination, energy from the entire visible spectral output of sun can be absorbed. For example, to accomplish a green colored polymer, it is necessary to have a material that simultaneously absorbs both the red and the blue portions of the electromagnetic spectrum.

Figure 3:
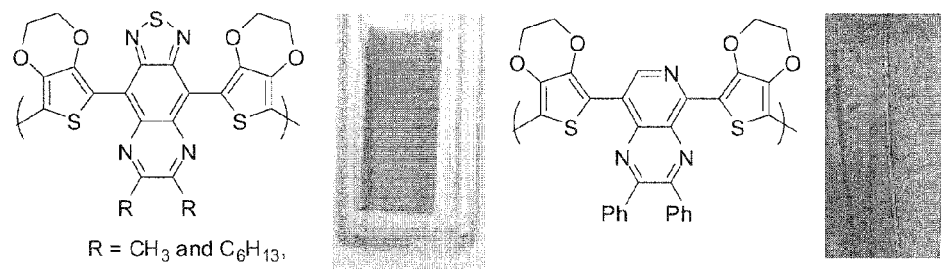
FIG. 3 shows photographic reproductions and chemical structures of two exemplary DA-CPs used for formation of solar blades according to embodiments of the invention.

The DA composite material can absorb sunlight having various different hues. For example, PBEDOT-PyrPyr is distinctly green in color as represented by the absorption curve 220 of FIG. 2 that shows peaks at 420 nm and 750 nm, with a transmission window between 500-550 nm (green light). However, the color that is called green can have different green variants by, for example, a slight change of chemical structures of the DA-CP. For example, PBEDOT-QTD can have a chemical repeat unit analogous to the green colored PBEDOT-PyrPyr as shown in FIG. 3, where the structure is adjacent to photographs for both green colored materials. As shown, an important subtlety is noted upon close observation of these two photographs in that, while both polymers would be called green, they have distinctly different hues. Specifically, the polymer PBEDOT-QTD on the left in FIG. 3 has a green that has a blue component, while the polymer PBEDOT-PyrPyr on the right in FIG. 3 has a yellow component. In addition, there is a difference in color saturation, with the polymer PBEDOT-PyrPyr on the right appearing a bit browner than the one PBEDOT-QTD on the left.

In various embodiments, the photoactive material can include inorganic materials and/or small active molecules. Suitable examples of inorganic materials can include semiconductor nanocrystals that are in the form of, for example, quantum dots, nanorods, tetrapods, or any other shapes. The inorganic semiconductor material can include, but is not limited to, a group IV semiconductor, such as Si or Ge, an II-VI semiconductor, such as ZnSe or CdSe, or an III-V semiconductor, such as InP or GaAs. The inorganic semiconductor material can also include a semiconductor alloy, such as $Si_xGe_{1-x}$, $Zn_xCd_{1-x}Se$, or $InAs_{1-y}P_y$ (where $0<x,y<1$). The inorganic semiconductor material can further include a metal oxide, such as ZnO or $TiO_x$.

Suitable examples of small active molecules can include small donor molecules such as metal free or metal containing phthalocyanines, porphorines, or acenes. Suitable examples of small active molecules can also include small acceptor molecules such as fullerene, perylene, naphthalene, or their derivatives.

The working electrode and the counter electrode can be laminated in a manner that the photoactive material can be disposed between the photoactive areas of electrodes. For example, the counter electrode shown in FIG. 1C can be flipped up side down with the conductive surface laminated on top of the structure shown in FIG. 1B. Meanwhile, the first stem and the second stem can form a pair of stems laminated having their conductive surfaces facing in opposite directions.

The two electrodes shown in FIG. 1 can both be optically clear so that light can be incident on the solar blade from any directions for an individual solar blade. The photoactive material sandwiched between the electrodes can therefore absorb light from various directions and then transform the absorbed light into electricity. For example, environmental conditions (e.g., wind) can change the orientation of a solar blade, which can also vary from solar blade to solar blade. The solar grass blade having an all-transparent structure (see FIG. 1D) can allow the light to be absorbed from various directions.

In various embodiments, however, it is not necessary for both electrodes to be optically transparent. For example, the solar blade 100 can include an opaque substrate or a partially opaque substrate for one of the electrodes shown in FIG. 1A and FIG. 1C and a transparent substrate for the other electrode. The final solar blade 100 shown in FIG. 1D can therefore include at least one transparent electrode. Such an exemplary solar blade 100 can be used in a variety of applications, for example, for large leaved "solar plant" with leaves having mostly fixed positions and orientation. Incident lights can then be predominantly fixed from a certain direction onto the at least one transparent side of the solar blade 100. In other words, the solar blade that includes the transparent electrode as well as the opaque electrode can be positioned with respect to the incident light such that the incident light can be absorbed by the photoactive material(s) through the at least one transparent electrode.

In various embodiments, the opaque electrode can include a conductive surface (e.g., opaque or transparent) formed over an opaque substrate. Specifically, the opaque or transparent electrode can include, for example, an opaque conductive surface, such as a metal layer (e.g., aluminum), or a transparent conductive surface, such as ITO. The opaque substrate can include, for example, a metal foil. The use of metal foil as the substrate has advantages over the plastic substrates due to much lower water and oxygen permeation rate in metal providing a greater environmental stability. Where the solar blade is constructed with an electrode core covered with the photoactive material that is covered with a complementary transparent electrode, the core electrode can be a reflective material, for example, a metal.

In various embodiments, as needed, an intermediate layer such as polymer layer can be formed between the conductive and the opaque substrate to provide an electrical insulation and a smooth surface. The polymer layer can include, for example, a polyimide layer. In an exemplary embodiment, a conductive surface can be deposited on a polymer layer that is deposited on one side of the opaque substrate. The other side of the opaque substrate can be painted in, for example, green color, or any other desired color.

Figure 4:
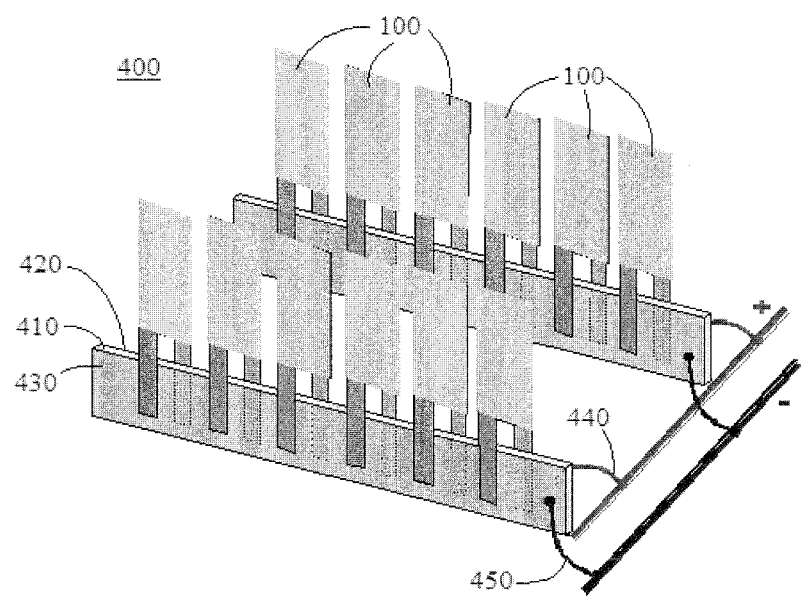
FIG. 4 is a schematic illustration of an assembled light harvesting artificial turf unit in accordance with an embodiment of the invention.

FIG. 4 is a schematic illustration of an assembled SolarTurf unit 400 in accordance with the subject invention. As shown, the SolarTurf unit 400 can include a number of solar blades of the structure illustrated in FIG. 1 D that are assembled and connected by an interconnect strip. The interconnect strip 410 can be formed of, for example, a plastic such as a PET. In one exemplary embodiment, the interconnect strip can be configured vertically on a base layer (not shown) providing an interface therebetween. The interconnect strip can also include a pair of vertical surfaces that are electrically conductive 420 and 430 and are electrically isolated by the interface. Such pair of conductive surfaces can be formed by coating conductive materials (e.g., a metal such as aluminum) to ensure an electrical connection with solar grass blades. In various embodiments, interconnect strip can be configured on a base layer (not shown) having various angles with the base layer.

As shown in FIG. 4, a number of solar blades 100 can be assembled and connected with the interconnect strip 410 in a manner having the photoactive area 130 positioned on the interconnect strip 410 with the first stems to the working electrode 110 of a multiplicity of solar blades 100 contacted with a first conductive surface 420 of the interconnect strip 410, and with the second stems to the counter electrode 120 of the multiplicity of solar blades 100 contacted with a second conductive surface 430 of the interconnect strip. The first stems to the working electrode 110 can service the anode or the cathode through a wire 440 that is connected with the first conductive surface 420 of the interconnect strip 410, while the second stems to the counter electrode 120 can be used to serve as complementary cathode or anode through a second wire 450 that is connected with the second conductive surface 430 of the interconnect strip 410.

In various embodiments, the SolarTurf unit 400 can further include a protective coating applied to all exposed surfaces to provide electric insulation and environmental stability for the whole device. Such an assembly of solar Hades can thereafter be used as the fundamental building block of a SolarTurf device. For example, a plurality of the linear assemblies (i.e., the SolarTurf unit 400) shown in FIG. 4 can be connected in series or in parallel to achieve a desired electrical signal, such as a desired voltage and/or current. The SolarTurf device can than be placed, for example, in a field, and exposed to light. Desired voltage and/or current signal can then be collected after light exposure and used as a power or signal source.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed is:

1. A SolarTurf unit comprising:
a plurality of solar blades and an interconnect strip,
wherein each of said solar blades comprises a first portion and a second portion;
wherein each first portion comprises a photoactive material that comprises at least one donor-acceptor conjugated polymer (DA-CP) with dioxythiophene donor repeating units disposed between and electrically contacting a working electrode and a counter electrode wherein at least one of said electrodes is transparent, wherein the photoactive material, the working electrode, and the counter electrode have the same cross-sectional shape in the first portion; and
wherein each second portion comprises an extension of each of the working electrode and the counter electrode from the first portion in a direction along the longitudinal axis of the first portion and wherein the longitudinal axis of the first portion and second portion is perpendicular to the longitudinal axis of the interconnect strip;
wherein the interconnect strip comprises a first electrically conductive surface and a second electrically conductive surface separated by an insulator wherein each working electrode is electrically and physically directly connected to said first electrically conductive surface and each counter electrode is electrically and physically directly connected to said second electrically conductive surface.

2. The SolarTurf unit of claim 1, wherein at least one of said working electrode and said counter electrode comprises a conductive surface on a substrate.

3. The SolarTurf unit of claim 1, further comprising a barrier layer to electrically and chemically isolate said solar blades and/or said interconnect strip.

4. The SolarTurf unit of claim 1, wherein said DA-CPs of said plurality of solar blades independently have a green, black, red, orange, yellow, blue or purple hue when in a neutral state.

5. The SolarTurf unit of claim 1, wherein said DA-CPs have a green hue when in neutral state.

6. The SolarTurf unit of claim 1, wherein said DA-CP comprises acceptor repeating units comprising an electron poor aromatic unit.

7. The SolarTurf unit of claim 6, wherein said electron poor aromatic unit comprises a substituted or unsubstituted benzothiadiazole, thiadiazoloquinoxaline, quinoxaline, thienothiadiazole, thienopyrazine, pyrazinoquinoxaline, benzobisthiadiazole or thiadiazolothienpyrazine.

8. The SolarTurf unit of claim 6, wherein said electron poor aromatic unit is a 2,1,3-benzothiadiazole (BTD).

9. The SolarTurf unit of claim 1, wherein said DA-CP comprises isolated acceptor repeating units separated by a plurality of donor repeating units.

10. The SolarTurf unit of claim 1, wherein at least one of said working electrode and said counter electrode further comprises a stem comprising an electrically conductive material extending from said working electrode and/or counter electrode at an area contacting said photoactive material wherein said stem provides electrical contact between said working electrode and said first electrically conductive surface or said counter electrode and said second electrically conductive surface.

11. A method of forming a SolarTurf unit according to claim 1, comprising:
providing a plurality of solar blades and an interconnect strip;
wherein each of said solar blades has a first portion and a second portion wherein the first portion comprises a photoactive material that comprises at least one donor-acceptor conjugated polymer (DA-CP) with dioxythiophene donor repeating units disposed between and electrically contacting a working electrode and a counter electrode wherein at least one of said electrodes is transparent wherein the photoactive material, the working electrode, and the counter electrode have the same cross-sectional shape in the first portion; and
providing an interconnect strip, wherein each second portion comprises an extension in the longitudinal axis of the first portion and wherein the longitudinal axis of the first portion and second portion is perpendicular to the longitudinal axis of the interconnect strip; and
the interconnect strip comprises a first electrically conductive surface and a second electrically conductive surface separated by an electrical insulator and electrically connects said solar blades to said interconnect strip wherein each working electrode is electrically and physically directly connected to said first electrically conductive surface and said counter electrode electrically and physically directly contacts said second electrically conductive surface.

12. The method of claim 11, further comprising the step of coating a protective layer over the assembly to provide electric insulation and environmental stability.

13. A method for collecting solar energy comprising:
forming a device comprising at least one SolarTurf unit according to claim 1 on a base, wherein said SolarTurf units absorb light of a portion of the visible spectrum wherein sunlight is converted into a desired electrical output;
placing the device at a location where the device is illuminated by sunlight; and
collecting said electrical output from the sunlight illuminated device.

14. The SolarTurf unit of claim 1, wherein said solar blades provided by said DA-CP are green and have a shape of a blade of grass, wherein said plurality of solar blades of said SolarTurf unit is configured as a portion of a lawn in a landscape.

15. The SolarTurf unit of claim 1, wherein at least some of said solar blades provided by said DA-CP are green and shapes of said solar blades permit said SolarTurf unit to be configured as a plant.

16. The SolarTurf unit of claim 1, wherein a color of said solar blade is the color of said DA-CP of said solar blade.

* * * * *

UNITED STATES PATENT AND TRADEMARK OFFICE
CERTIFICATE OF CORRECTION

PATENT NO.       : 8,648,247 B2
APPLICATION NO.  : 12/745285
DATED            : February 11, 2014
INVENTOR(S)      : Jiangeng Xue et al.

It is certified that error appears in the above-identified patent and that said Letters Patent is hereby corrected as shown below:

In the Specification

Column 1,
Line 18, "of their" should read --of its--.

Column 2,
Line 34, "blades implies" should read --blades imply--.
Line 39, "can appears" should read --can appear--.

Column 5,
Line 57, "2,3-diphenyipyrido" should read --2,3-diphenylpyrido--.
Lines 60-61, "(poly[2-methoxy-5-(T-ethyl-hexyloxy)" should read --(poly[2-methoxy-5-(2'-ethyl-hexyloxy)--.

Signed and Sealed this
Tenth Day of June, 2014

Michelle K. Lee
*Deputy Director of the United States Patent and Trademark Office*